US010042000B2

(12) United States Patent
Moeneclaey

(10) Patent No.: US 10,042,000 B2
(45) Date of Patent: Aug. 7, 2018

(54) METHOD AND APPARATUS FOR HIGH FREQUENCY ANALOG-TO-DIGITAL CONVERSION

(71) Applicant: STMicroelectronics (Grenoble 2) SAS, Grenoble (FR)

(72) Inventor: Nicolas Moeneclaey, Vourey (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 0 days.

(21) Appl. No.: 15/689,237

(22) Filed: Aug. 29, 2017

(65) Prior Publication Data

US 2018/0106864 A1 Apr. 19, 2018

Related U.S. Application Data

(63) Continuation-in-part of application No. 15/492,139, filed on Apr. 20, 2017, now Pat. No. 9,807,334.

(30) Foreign Application Priority Data

Oct. 13, 2016 (FR) ..................................... 16 59885
Feb. 1, 2017 (FR) ..................................... 17 50825

(51) Int. Cl.
*H03M 1/50* (2006.01)
*G01R 31/3193* (2006.01)
*G01R 31/3187* (2006.01)
*H04L 7/00* (2006.01)
*H03L 7/18* (2006.01)
(Continued)

(52) U.S. Cl.
CPC ... *G01R 31/31937* (2013.01); *G01R 31/3187* (2013.01); *G01R 31/31718* (2013.01); *H03L 7/085* (2013.01); *H03L 7/18* (2013.01); *H04L 7/0025* (2013.01); *H01L 27/14643* (2013.01); *H03M 1/00* (2013.01); *H03M 1/12* (2013.01);
(Continued)

(58) Field of Classification Search
CPC .. H03M 2201/4233; H03M 1/00; H03M 1/12; H04N 5/335; H04N 3/155; H01L 27/14643
USPC ............... 341/166, 165, 164, 163, 158, 155; 348/311, 302, 308; 250/208.1
See application file for complete search history.

(56) References Cited

U.S. PATENT DOCUMENTS

| 4,147,891 A | 4/1979 | Roos |
| 6,229,358 B1 | 5/2001 | Boerstler et al. |
| 2009/0159782 A1* | 6/2009 | Murakami .......... H03M 1/1023 250/208.1 |

FOREIGN PATENT DOCUMENTS

FR 3036247 A1 11/2016

* cited by examiner

*Primary Examiner* — Joseph Lauture
(74) *Attorney, Agent, or Firm* — Slater Matsil, LLP

(57) ABSTRACT

A method can be used to generate a reference clock signal having a reference frequency. N clock sub-signals are generated, where N is greater than or equal to 2. The N clock sub-signals are successively mutually shifted out of phase by $\pi/N$ and each clock sub-signal has an elementary frequency that is equal to the reference frequency divided by N. The N clock sub-signals are propagated over propagation paths. The elementary frequency and a length of the longest propagation path are chosen so that each sub-signal has an acceptable degree of deformation. The duration of each sub-signal edge is longer than quarter of the period of the reference frequency. The reference clock signal is generated by EXCLUSIVE OR combining the propagated clock sub-signals at the end of their respective propagation paths.

20 Claims, 4 Drawing Sheets

(51) Int. Cl.
- *H03L 7/085* (2006.01)
- *G01R 31/317* (2006.01)
- *H03M 1/12* (2006.01)
- *H03M 1/00* (2006.01)
- *H04N 5/335* (2011.01)
- *H04N 3/14* (2006.01)
- *H01L 27/146* (2006.01)

(52) U.S. Cl.
CPC ..... *H03M 2201/4233* (2013.01); *H04N 3/155* (2013.01); *H04N 5/335* (2013.01)

METHOD AND APPARATUS FOR HIGH FREQUENCY ANALOG-TO-DIGITAL CONVERSION

CROSS-REFERENCE TO RELATED APPLICATIONS

This application is a continuation-in-part of U.S. patent application Ser. No. 15/492,139, filed on Apr. 20, 2017, and claims priority to French Patent Application No. 1750825, filed on Feb. 1, 2017, and French Patent Application No. 1659885, filed on Oct. 13, 2016, which applications are hereby incorporated herein by reference.

TECHNICAL FIELD

Modes of implementation and embodiments of the invention relate to the propagation of signals and, in particular embodiments, to the propagation of high-frequency clock signals through integrated circuits such as, by way of non-limiting example, imager circuits.

BACKGROUND

Conventionally, an imager circuit comprises a matrix of pixels that are coupled to charge transfer circuits allowing the electric charge of the pixels to be transferred to a processing circuit after each exposure of the pixel.

The processing circuit may comprise a plurality of analog-digital converters allowing, for each column of the matrix of pixels, the charge value of the pixel to be converted, row by row, to a digital value.

The analog-digital conversion operation may be clocked using a single clock signal generator common to all of the analog-digital converters of the circuit. The clock signal is therefore propagated from the clock signal generator over a distance that is proportional to the size of the matrix of pixels, in order to be transmitted to the analog-digital converter associated with each column.

In order to obtain a high level of precision during the analog-digital conversion of the signal, it is preferable for the frequency of the oscillator to be as high as possible. Thus, doubling the frequency of the clock signal makes it possible to obtain a digital value coded on an additional bit.

As such, the higher the frequency of the signal, the more difficult it is to transmit it over long distances without this leading to a deformation of the signal.

FIG. 1 illustrates two timing diagrams c1 and c2 showing the variation in a clock signal of 800 MHz in frequency generated by a clock signal generator.

The first timing diagram c1 corresponds to a measurement of the signal taken directly at the output of the clock signal generator while the clock signal generator is not coupled to any propagation path. The duration t of the edges of the signal is short here, and shorter than quarter of the period of the signal.

The second timing diagram c2 corresponds to a measurement of the signal taken at the end of a propagation path of 4 millimeters.

It is observed that the signal is deformed.

Specifically, due in particular to the high capacitive load of the optical path, the duration of the edges of the signal is longer than quarter of the period of the signal. This deformation depends on the characteristics of the propagation path.

Conventionally, a follower amplifier is located at the end of the propagation line, making it possible to compensate for deformations of the signal. However, if the signal is deformed such that the duration of its edges is longer than quarter of the period of the signal, then the follower amplifier will no longer be capable of reshaping the signal, and the signal output by the follower amplifier will include distortions, such as, for example, high states and low states of different durations.

Thus, a signal is acceptable, i.e., considered to be non-deformed, if, for example, the duration of its edges at the input of the follower amplifier is shorter than quarter of the period of the signal.

It has been observed that the degree of deformation of the signal increases notably with the frequency of the propagated signal, and/or with the length of the propagation path.

It is therefore not currently possible to use a single high-frequency clock signal generator to clock all of the analog-digital converters of an imager once the size of its matrix of pixels becomes too large (typically a few millimeters).

SUMMARY

Thus, a method and a device for generating a clock signal are proposed here that allow a high-frequency clock signal to be propagated over a long distance while limiting the deformation of the signal.

According to one aspect, a method is proposed for designing a reference clock signal having a reference frequency. N clock sub-signals are generated, where N is greater than or equal to 2. The N clock sub-signals are successively mutually shifted out of phase by $\pi/N$ and each having an elementary frequency that is equal to the reference frequency divided by N. The N sub-signals are propagated over propagation paths, the elementary frequency and the length of the longest propagation path being chosen so that each sub-signal has an acceptable degree of deformation. The duration of each sub-signal edge is longer than or equal to quarter of the period of the reference signal. A combining step is carried out at the end of their respective propagation paths and includes at least one EXCLUSIVE OR combining operation between two of the propagated clock sub-signals in order to obtain the reference clock signal.

Stated otherwise, the frequency of the sub-signals and the length of the propagation paths are chosen so that each sub-signal has an acceptable degree of deformation. However, if the reference clock signal were propagated over the propagation path, it would have an overly high degree of deformation.

Stated otherwise, the duration of the edges of any signal being propagated over the propagation path is longer than quarter of the period of the reference signal.

It is therefore particularly advantageous to propagate sub-signals of lower frequency over the propagation paths and to combine them as needed in order to obtain a higher frequency signal on time.

Those skilled in the art will be able to determine the frequency of the sub-signals and the length of the propagation paths according to the envisaged applications.

Stated otherwise, those skilled in the art will be able to choose the degree of deformation that is acceptable according to the envisaged application.

Although an acceptable degree of deformation may be represented by multiple criteria, such as, for example, a ratio of the peak-to-peak amplitude of the sub-signal at the end of the propagation path to the peak-to-peak amplitude of the sub-signal at the input of the propagation path being above a determined threshold, it is particularly advantageous and simple to use the duration of the edges of the sub-signal as the criterion.

Thus, an acceptable degree of deformation may be represented by a sub-signal the duration of the edges of which is shorter than quarter of its period.

The length of the propagation path may be greater than or equal to 8 mm and the frequency of the reference clock signal may be higher than or equal to 800 MHz.

According to one mode of implementation, N is equal to 3 and the combining step includes a first EXCLUSIVE OR combining operation between a first propagated clock sub-signal and a second propagated clock sub-signal, which are mutually shifted out of phase by $\pi/3$, carried out at the end of their respective propagation path in order to obtain an intermediate clock signal, and a second EXCLUSIVE OR combining operation between the intermediate clock signal and a third propagated clock sub-signal carried out at the end of the propagation path of this third sub-signal in order to obtain the reference clock signal.

According to another mode of implementation, N is greater than 3, and the combining step includes N−1 EXCLUSIVE OR combining operations, each combining operation generating an intermediate clock signal and involving two propagated clock sub-signals from among the N propagated clock sub-signals, or two intermediate clock signals, or a propagated sub-signal and an intermediate clock signal, the clock signal resulting from these N−1 combining operations forming the reference clock signal.

According to another aspect, a device is proposed for generating a reference clock signal having a reference frequency. A signal generator is configured to generate N clock sub-signals, where N is greater than or equal to 2. The N clock sub-signals are successively mutually shifted out of phase by $\pi/N$, each having an elementary frequency that is equal to the reference frequency divided by N. N propagation paths are configured to propagate the N clock sub-signals. The elementary frequency and the length of the longest propagation path are chosen so that each sub-signal has an acceptable degree of deformation and the duration of each sub-signal edge is longer than quarter of the period of the reference signal. A combiner includes N inputs coupled to the N propagation paths, respectively, in order to receive N propagated sub-signals, and an output configured to deliver the reference clock signal. The combiner is configured to carry out at least one EXCLUSIVE OR combining operation between two propagated clock sub-signals.

According to one embodiment, the elementary frequency and the length of the longest propagation path are chosen so that the duration of the edges of each sub-signal is shorter than quarter of the period of the sub-signal. The length of the propagation path may be greater than or equal to 8 mm and the frequency of the reference clock signal is higher than or equal to 800 MHz.

According to one embodiment, N is equal to 3 and the combiner comprises a first EXCLUSIVE OR logic gate and a second EXCLUSIVE OR logic gate, the first logic gate being configured to receive a separate clock sub-signal over each of its inputs, the second logic gate being configured to receive a third clock sub-signal over one of its inputs and the output signal of the first logic gate over the other of its inputs, the output of the second logic gate forming the output of the device.

According to another embodiment, N is greater than 3 and the combiner includes N−1 EXCLUSIVE OR logic gates, the two inputs of each logic gate being coupled to two separate propagation paths, or one of the inputs thereof being coupled to one propagation path and the other input thereof being coupled to the output of another logic gate, or the two inputs thereof being coupled to the outputs of two other separate logic gates, the signal resulting from the N−1 combining operations carried out in the N−1 logic gates forming the reference clock signal.

According to another aspect, an analog-digital converter is proposed comprising a signal input configured to receive a signal to be converted, a clock input configured to receive a clock signal and a converter that is coupled to the two inputs, characterized in that the clock input is coupled to a device such as described above.

According to another aspect, an imager is proposed comprising a matrix of pixels, each column of the matrix of pixels being coupled to an analog-digital converter such as described above, each converter including its own combiner, the propagation paths extending at least partly in parallel to one side of the matrix, and the length of at least one propagation path being greater than or equal to the length of a row of the matrix of pixels, the clock sub-signal generator being common to all of the analog-digital converters.

BRIEF DESCRIPTION OF THE DRAWINGS

Other advantages and features of the invention will become apparent upon examining the detailed description of wholly non-limiting implementations and embodiments of the invention and the appended drawings in which.

DETAILED DESCRIPTION OF ILLUSTRATIVE EMBODIMENTS

Figure 2:
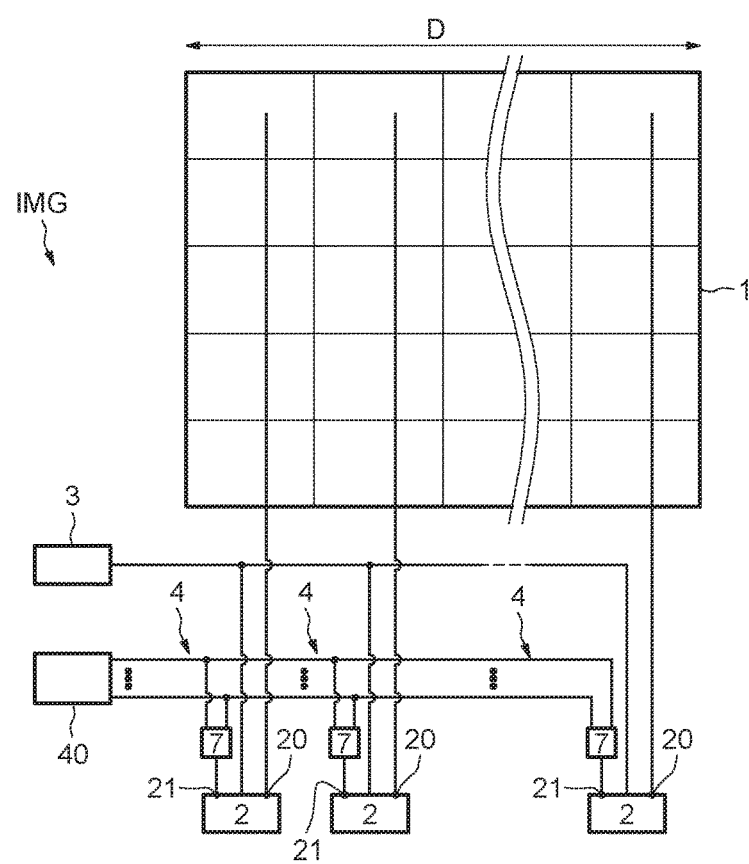
FIGS. 2 to 5 show modes of implementation and embodiments of the invention.

FIG. 2 illustrates an imager device IMG, for example, an optical sensor of a digital camera.

The imager device IMG includes a matrix 1 of pixels, each column of which is coupled to an analog-digital converter 2 each including a signal input 20 configured to receive the signal of the pixel to be converted and a clock input 21 configured to receive a clock signal.

A ramp signal generator 3, configured to deliver a rising voltage ramp, is common to all of the analog-digital converters 2.

Each analog-digital converter is coupled to a clock generator 4 that generates a reference clock signal, including a generator 40 for generating multiple clock sub-signals, which is common to all of the devices for generating reference signals, along with circuitry 7 (e.g., a combiner) for combining these sub-signals.

The matrix here is shown schematically, and although only a few pixels are shown for the sake of simplicity, in reality the matrix is a matrix of 1000×1000 identical pixels. The matrix here is square in shape and the length D of each of its sides is 8 millimeters.

Figure 3:
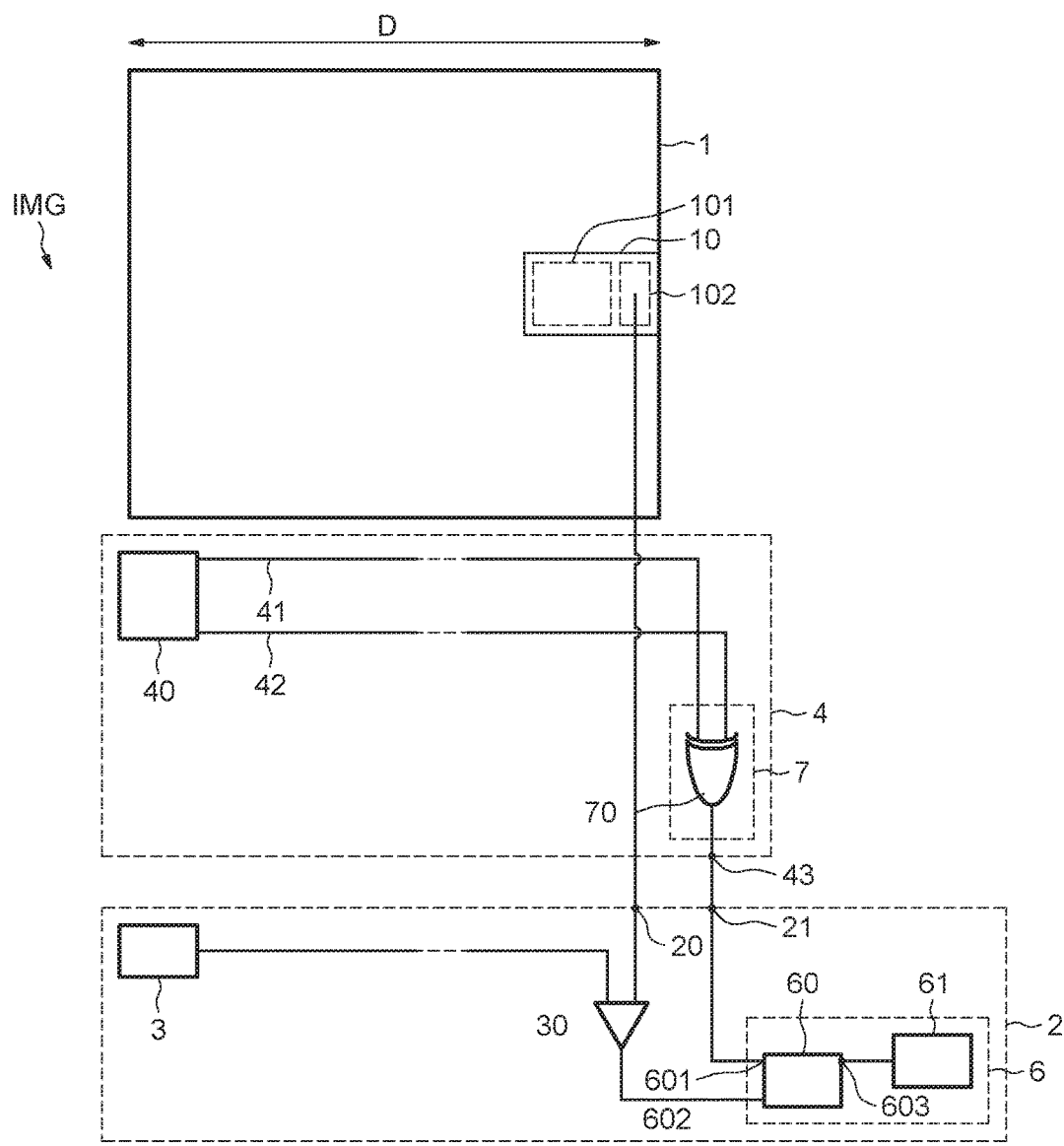

FIG. 3 is a more detailed illustration of an analog-digital converter 2 coupled to a pixel 10 of a column of the matrix 1, here the column located at the right end of the matrix.

It should be noted that although only one converter is shown in FIG. 3, in practice each column of the matrix is associated with a converter identical to that shown in FIG. 3, in a manner analogous to that which is shown in FIG. 2.

The pixel 10 conventionally includes a photoreceptor 101, for example a photodiode, coupled to a charge transfer circuit 102, itself coupled to the interconnect portion of the circuit and allowing the transfer of charge from the pixel to an analog-digital converter 2 after each exposure of the matrix.

The analog-digital converter 2 includes a comparator 30, the ramp generator 3 and a signal generator 6 to generate a counter signal.

The clock input 21 of the analog-digital converter 2 is coupled to a device for generating a reference clock signal 4.

The ramp generator 3 here is coupled to one input of the comparator 30, a second input of which forms the signal input 20 of the analog-digital converter 2 and is coupled to the charge transfer circuit 102, and the output of which is coupled to the signal generator 6.

The signal generator 6 conventionally includes a latch-type flip-flop 60, the control input 601 of which is coupled to the output 43 of the reference clock signal generator 4 and the data input 602 of which is coupled to the output of the comparator 30.

The output 603 of the latch 60 is coupled to the input of a counter 61 that is configured to deliver the charge value of the pixel in the form of a digital value coded in binary.

The device for generating the reference clock signal 4 includes the clock sub-signal generator 40, here configured to deliver two clock sub-signals of elementary frequency, 400 MHz in this instance, and mutually shifted out of phase by $\pi/2$.

The clock sub-signal generator 40 may, for example, comprise a ring oscillator coupled to a phase-locked loop, both coupled to two delay chains and allowing the two phase-shifted sub-signals to be generated.

The clock sub-signal generator 40 here is coupled to two propagation paths 41 and 42 that extend in parallel to one of the sides of the matrix 1.

Here, the paths 41 and 42 comprise metal tracks that are formed in the interconnect portion of the imager circuit IMG and associated interconnect vias, and the lengths of which are close to the length D of the sides of the matrix.

Here, the elementary frequency and the length D are chosen such that the duration of the edges of each sub-signal, at any point on the propagation path, is shorter than quarter of the period of the sub-signal.

Thus, the sub-signals may be propagated over the entire length of the propagation paths with an acceptable degree of deformation.

The optical paths 41 and 42 are coupled to combiner 7, here comprising an EXCLUSIVE OR logic gate 70, the output of which is coupled to the control input 601 of the latch 60. Here, the output of the logic gate 70 forms the output 43 of the device for generating the reference clock signal 4 and delivers a reference clock signal the frequency F of which is equal to 800 MHz.

In operation, when the charge transfer circuit 102 of the pixel 10 transmits the electric charge of the pixel to the input of the comparator 30, the ramp generator generates a rising voltage ramp, and when the value of the voltage ramp is higher than or equal to the value of the charge of the pixel, the output of the comparator 30 generates a signal in the high state.

The data input 602 of the latch 60 therefore passes to the high state, and the latch 60 transmits the signal present on its control input 601 over its output, i.e., the reference clock signal the frequency F of which is equal to 800 MHz.

The counter 61 is then incremented on each edge of the signal delivered by the output 603.

Once the ramp reaches its maximum value, it is reset and the signal at the output of the comparator returns to the low state. The counter 61 therefore stops being incremented and the binary value that it delivers is then representative of the value of the charge of the pixel.

The precision of the analog-digital converter depends on the frequency.

Thus, clocking the analog-digital conversion operation at the frequency F of 800 MHz allows the charge value of the pixel to be coded on an additional bit with respect to a conversion operation clocked at 400 MHz.

Moreover, the device for generating a reference signal advantageously allows the analog-digital conversion operation to be clocked with the reference signal.

Were the imager to use conventional circuitry for generating a clock signal, the edge durations of the reference signal F would be longer than quarter of the period of the signal, and could therefore not be reshaped by a follower amplifier at the end of the line. It would therefore not be acceptable for the purpose of clocking analog-digital conversion operations, in particular those associated with the pixel columns located furthest away from the clock signal generator.

Figure 4:
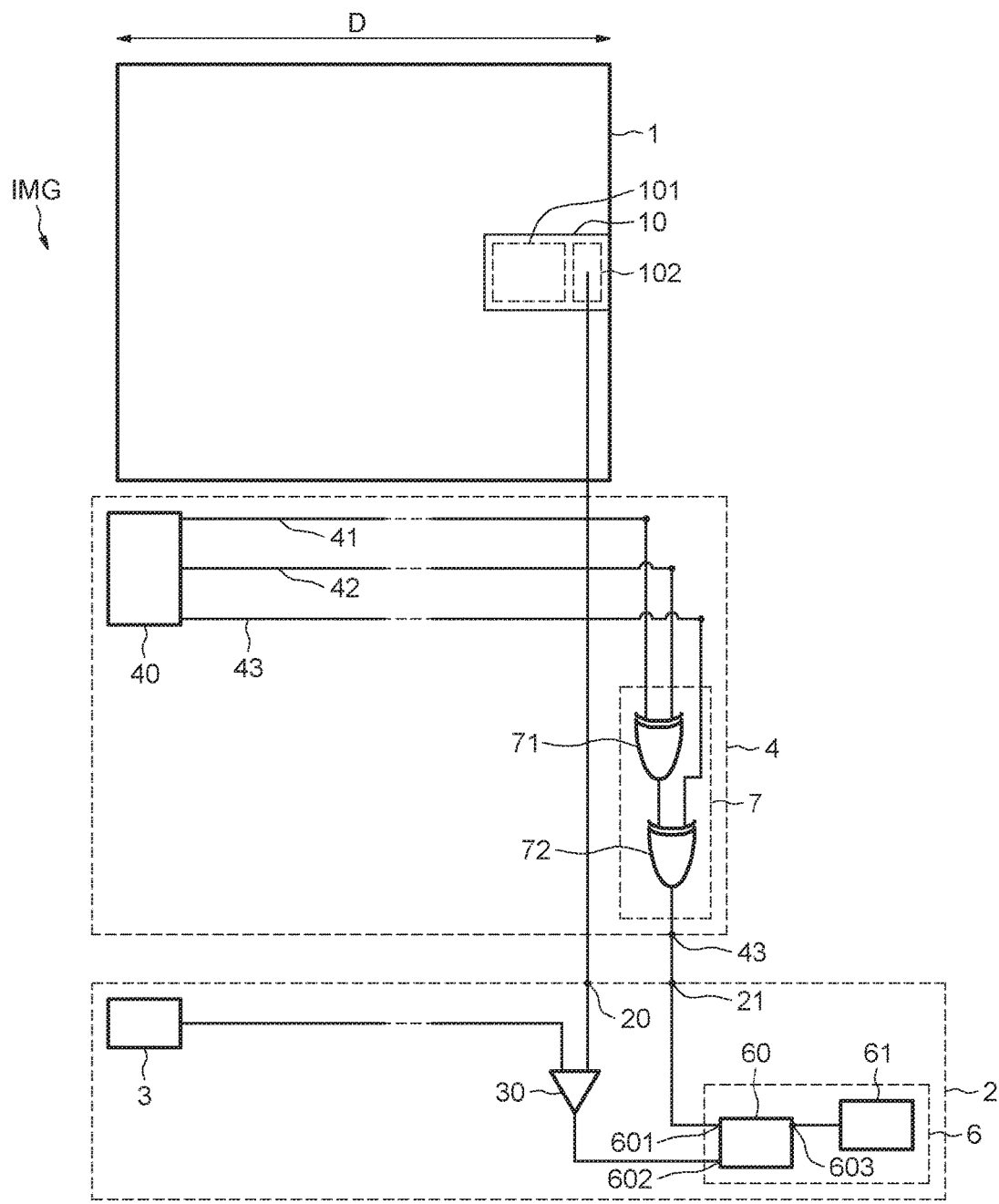

As illustrated in FIG. 4, the embodiments of the invention are not limited to a sub-signal generator delivering two sub-signals.

Here, the device for generating the reference clock signal 4 includes a sub-signal generator 40 configured to deliver three sub-signals of identical frequency, for example 300 MHz in this instance, and successively shifted out of phase by $\pi/3$.

The sub-signal generator 40 here is coupled to three optical paths 41, 42 and 43, and the three optical paths are coupled to signal combiner 7, here two EXCLUSIVE OR logic gates 71 and 72.

The first optical path 41 and the second optical path 42 are coupled to the input of the first logic gate 71, and the third optical path 43 and the output of the first logic gate 71 are coupled to the input of the second logic gate 72.

The output of the second logic gate 72 here forms the output 43 of the device for generating the reference clock signal 4 and is configured to deliver a reference clock signal the frequency of which is equal to 900 MHz, namely three times the elementary frequency.

Figure 5:
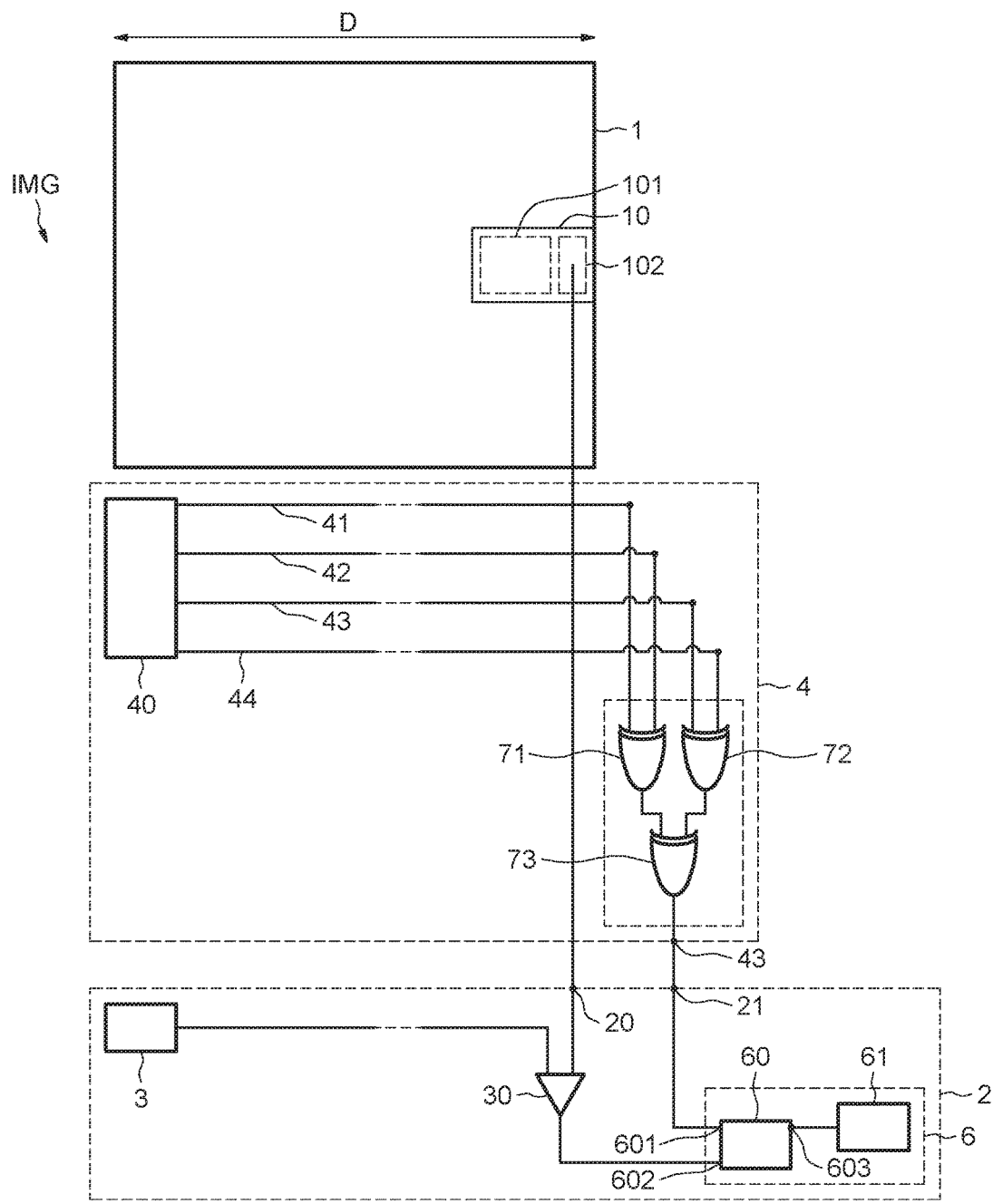

As illustrated in FIG. 5, the embodiments of the invention also comprise devices in which the sub-signal generator is configured to deliver a number N, where N is greater than 3, of sub-signals that are successively shifted out of phase by $\pi/N$.

Here, the device for generating the reference clock signal 4 includes a sub-signal generator 40 configured to deliver four sub-signals of identical frequency, for example 200 MHz in this instance, and successively shifted out of phase by $\pi/4$.

The sub-signal generator 40 here is coupled to four optical paths 41, 42, 43 and 44, and the four optical paths are coupled to signal combiner 7, here three EXCLUSIVE OR logic gates 71, 72 and 73.

The first optical path 41 and the second optical path 42 are coupled to the input of the first logic gate 71, and the third optical path 43 and the fourth optical path are coupled to the input of the second logic gate 72. The output of the first logic gate 71 and the output of the second logic gate are coupled to the input of the third logic gate 73.

The output of the third logic gate 73 here forms the output 43 of the device for generating the reference clock signal 4 and is configured to deliver a reference clock signal the frequency of which is equal to 800 MHz.

Figure 1:
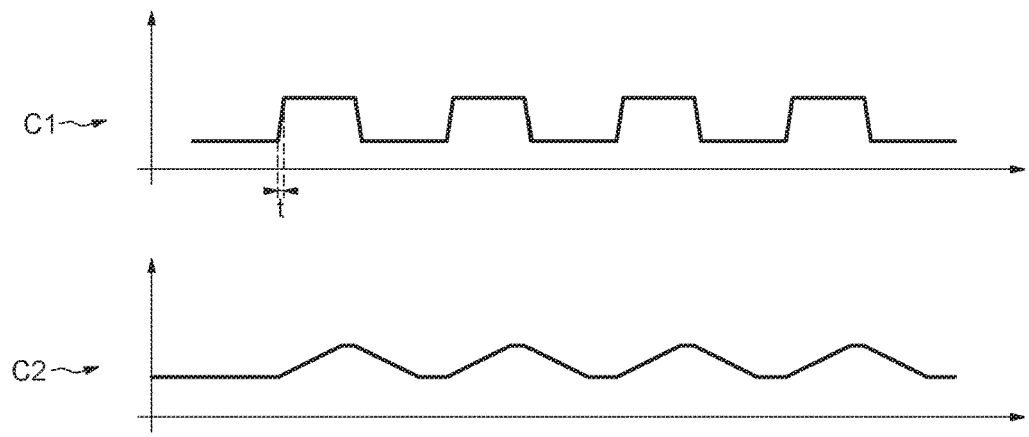
FIG. 1, described above, illustrates a deformation of a clock signal.

The embodiments of the invention are not limited to those presented here and illustrated by FIGS. 1 to 3, and it would also be possible to envisage devices for generating reference clock signals comprising signal generator 40 that is configured to deliver any number N of clock sub-signals, which are successively shifted out of phase by π/N and combined with one another by the combiner that includes N−1 logic gates in order to obtain a reference clock signal the frequency of which is N times higher than the frequency of the clock sub-signals.

Although the invention may advantageously be applied to imaging devices, it would also be possible to envisage any electronic device in which the operations carried out are clocked using a device for generating a reference clock signal according to one embodiment of the invention.

What is claimed is:

1. A method for generating a reference clock signal having a reference frequency, the method comprising:
generating N clock sub-signals, where N is greater than or equal to 2, the N clock sub-signals being successively mutually shifted out of phase by π/N, wherein each clock sub-signal has an elementary frequency that is equal to the reference frequency divided by N;
propagating the N clock sub-signals over propagation paths, the elementary frequency and a length of the longest propagation path being chosen so that each sub-signal has an acceptable degree of deformation so that each sub-signal edge has a duration that is longer than quarter of the period of the reference frequency; and
obtaining the reference clock signal by EXCLUSIVE OR combining the propagated clock sub-signals at the end of their respective propagation paths.

2. The method according to claim 1, wherein the elementary frequency and the length of the longest propagation path are chosen so that edges of each sub-signal have a duration that is shorter than quarter of the period of the sub-signal.

3. The method according to claim 1, wherein the length of the longest propagation path is greater than or equal to 8 mm and the reference frequency is higher than or equal to 800 MHz.

4. The method according to claim 1, wherein N is equal to 3 and the EXCLUSIVE OR combining includes a first EXCLUSIVE OR combining operation between a first propagated clock sub-signal and a second propagated clock sub-signal, which are mutually shifted out of phase by π/3, carried out at the end of their respective propagation path in order to obtain an intermediate clock signal, and a second EXCLUSIVE OR combining operation between the intermediate clock signal and a third propagated clock sub-signal carried out at the end of the propagation path of this third sub-signal in order to obtain the reference clock signal.

5. The method according to claim 1, wherein N is greater than 3, and the EXCLUSIVE OR combining includes N−1 EXCLUSIVE OR combining operations, each combining operation generating an intermediate clock signal and involving two propagated clock sub-signals from among the N propagated clock sub-signals, or two intermediate clock signals, or a propagated sub-signal and an intermediate clock signal, a clock signal resulting from these N−1 combining operations forming the reference clock signal.

6. A device comprising:
a signal generator configured to generate N clock sub-signals that are successively mutually shifted out of phase by π/N and each have an elementary frequency that is equal to a reference frequency divided by N, where N is greater than or equal to 2;
N propagation paths configured to propagate the N clock sub-signals, the elementary frequency and a length of the longest propagation path being chosen so that each sub-signal has an acceptable degree of deformation, a duration of each sub-signal edge being longer than quarter of a period of a reference clock signal being generated by the device; and
a combiner including N inputs coupled to the N propagation paths, respectively, in order to receive N propagated sub-signals, the combiner also including an output configured to deliver the reference clock signal, the combiner being configured to carry out at least one EXCLUSIVE OR combining operation between two propagated clock sub-signals.

7. The device according to claim 6, wherein the elementary frequency and the length of the longest propagation path are chosen so that the duration of the edges of each sub-signal is shorter than quarter of the period of the sub-signal.

8. The device according to claim 6, wherein the length of the longest propagation path is greater than or equal to 8 mm and the frequency of the reference clock signal is higher than or equal to 800 MHz.

9. The device according to claim 6, wherein N is equal to 3 and the combiner comprises a first EXCLUSIVE OR logic gate and a second EXCLUSIVE OR logic gate;
wherein the first EXCLUSIVE OR logic gate has a first input coupled to receive a first clock sub-signal and a second input coupled to receive a second clock sub-signal;
wherein the second EXCLUSIVE OR logic gate has a first input coupled to receive a third clock sub-signal and a second input coupled to an output of the first EXCLUSIVE OR logic gate; and
wherein an output of the second EXCLUSIVE OR logic gate forms an output to provide the reference clock signal.

10. The device according to claim 6, wherein N is greater than 3 and the combiner includes N−1 EXCLUSIVE OR logic gates that each include two inputs and an output;
wherein the two inputs of each logic gate are coupled to two separate propagation paths, or wherein one of the inputs is coupled to one propagation path and the other input is coupled to an output of another logic gate, or wherein the two inputs are coupled to outputs of two other separate logic gates; and
wherein a signal resulting from the N−1 combining operations carried out in the N−1 logic gates forms the reference clock signal.

11. The device according to claim 6, further comprising an analog-digital converter comprising a signal input coupled to receive a signal to be converted, a clock input coupled to receive a clock signal and a counter coupled to the signal input and the clock input, wherein the clock input is coupled to the output of the combiner.

12. An imager comprising:
a signal generator configured to generate N clock sub-signals that are successively mutually shifted out of phase by π/N and each have an elementary frequency that is equal to a reference frequency divided by N, where N is greater than or equal to 2;
N propagation paths configured to propagate the N clock sub-signals, the elementary frequency and a length of the longest propagation path being chosen so that each sub-signal has an acceptable degree of deformation, a duration of each sub-signal edge being longer than quarter of a period of a reference clock signal being generated;

a plurality of combiners, each combiner including N inputs coupled to the N propagation paths, respectively, in order to receive N propagated sub-signals, each combiner also including an output configured to deliver the reference clock signal, the combiner being configured to carry out at least one EXCLUSIVE OR combining operation between two propagated clock sub-signals;

a plurality of analog-digital converters, each analog-digital converter having a clock input coupled to the output of a corresponding one of the combiners; and a matrix of pixels arranged in rows and columns, each column of the matrix of pixels being coupled to a signal input of a corresponding analog-digital converter, wherein the propagation paths extend at least partly in parallel to one side of the matrix, at least one propagation path having a length that is greater than or equal to the length of a row of the matrix of pixels.

13. The imager according to claim 12, wherein the elementary frequency and the length of the longest propagation path are chosen so that the duration of the edges of each sub-signal is shorter than quarter of the period of the sub-signal.

14. The imager according to claim 12, wherein the length of the longest propagation path is greater than or equal to 8 mm and the frequency of the reference clock signal is higher than or equal to 800 MHz.

15. The imager according to claim 14, wherein the matrix is square in shape and each side of matrix has a length of 8 millimeters.

16. The imager according to claim 12, wherein N is equal to 3 and the combiner comprises a first EXCLUSIVE OR logic gate and a second EXCLUSIVE OR logic gate;

wherein the first EXCLUSIVE OR logic gate has a first input coupled to receive a first clock sub-signal and a second input coupled to receive a second clock sub-signal;

wherein the second EXCLUSIVE OR logic gate has a first input coupled to receive a third clock sub-signal and a second input coupled to an output of the first EXCLUSIVE OR logic gate; and wherein an output of the second EXCLUSIVE OR logic gate forms an output to provide the reference clock signal.

17. The imager according to claim 12, wherein N is greater than 3 and the combiner includes N−1 EXCLUSIVE OR logic gates that each include two inputs and an output;

wherein the two inputs of each logic gate are coupled to two separate propagation paths, or wherein one of the inputs is coupled to one propagation path and the other input is coupled to an output of another logic gate, or wherein the two inputs are coupled to outputs of two other separate logic gates; and wherein a signal resulting from the N−1 combining operations carried out in the N−1 logic gates forms the reference clock signal.

18. The imager according to claim 12, wherein the matrix includes a million identical pixels.

19. The imager according to claim 12, wherein the propagation paths comprise metal tracks that are formed in an interconnect portion of the imager and associated interconnect vias.

20. The imager according to claim 19, wherein the matrix is square in shape and the metal tracks have a length that are close to a length of sides of the matrix.

* * * * *